(12) United States Patent
Romano et al.

(10) Patent No.: US 9,000,815 B2
(45) Date of Patent: Apr. 7, 2015

(54) FRACTIONAL SPUR REDUCTION USING CONTROLLED CLOCK JITTER

(71) Applicant: Marvell World Trade Ltd., St. Michael (BB)

(72) Inventors: Luca Romano, Milan (IT); Alessandro Venca, Tortona (IT); Stefano Dal Toso, Montegalda (IT); Antonio Milani, Marzano (IT); Brian Brunn, Bee Cave, TX (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/839,696

(22) Filed: Mar. 15, 2013

(65) Prior Publication Data

US 2013/0200933 A1 Aug. 8, 2013

Related U.S. Application Data

(63) Continuation of application No. 13/191,329, filed on Jul. 26, 2011, now Pat. No. 8,400,197.

(60) Provisional application No. 61/368,459, filed on Jul. 28, 2010.

(51) Int. Cl.
| | | |
|---|---|---|
| H03L 7/06 | (2006.01) |
| H03L 7/08 | (2006.01) |
| H03L 7/07 | (2006.01) |
| H03L 7/081 | (2006.01) |

(52) U.S. Cl.
CPC .. *H03L 7/08* (2013.01); *H03L 7/07* (2013.01); *H03L 7/0805* (2013.01); *H03L 7/0816* (2013.01)

(58) Field of Classification Search
USPC .............. 327/141, 144–163; 331/1 A, 15–17; 375/373–376
See application file for complete search history.

(56) References Cited

U.S. PATENT DOCUMENTS

| | | | | |
|---|---|---|---|---|
| 5,825,253 | A | * | 10/1998 | Mathe et al. ..................... 331/18 |
| 7,983,375 | B2 | * | 7/2011 | Dulger et al. ................. 375/376 |
| 2002/0196061 | A1 | * | 12/2002 | Atyunin et al. ............... 327/158 |
| 2007/0164884 | A1 | | 7/2007 | Ihs |
| 2007/0276891 | A1 | | 11/2007 | Warner et al. |
| 2008/0136534 | A1 | * | 6/2008 | Li .................................. 331/17 |
| 2008/0192876 | A1 | * | 8/2008 | Dulger et al. ................. 375/376 |
| 2009/0167383 | A1 | | 7/2009 | Bratschke et al. |
| 2009/0302906 | A1 | | 12/2009 | Rhee et al. |
| 2010/0052797 | A1 | | 3/2010 | Carley et al. |

(Continued)

OTHER PUBLICATIONS

Enrico Temporiti et al., "A 700-kHz Bandwidth Fractional Synthesizer With Spurs Compensation and Linearization Techniques for WCDMA Applications", IEEE Journal of Solid-State Circuits, Sep. 2004, Vo., 39, No. 9.

(Continued)

*Primary Examiner* — Brandon S Cole

(57) ABSTRACT

In one embodiment, an apparatus includes a jitter generator configured to receive a reference clock; add jitter to the reference clock; and output the reference clock with the included jitter to a phase lock loop (PLL). The PLL is used to generate a local oscillator (LO) signal for a transceiver. A jitter controller outputs a signal to the jitter generator to control a characteristic of the jitter added to the reference clock. The reference clock with the added jitter is used to reduce a fractional spur caused by a radio frequency (RF) attacker coupling into the PLL.

20 Claims, 12 Drawing Sheets

(56) References Cited

U.S. PATENT DOCUMENTS

2011/0116586 A1    5/2011   Chang et al.
2013/0342251 A1*  12/2013   Patel et al. .................... 327/158

OTHER PUBLICATIONS

Oren Eytan Eliezer, "A Phase Domain Approach for Mitigation of Self-Interference in Wireless Transceivers", IEEE Journal of Solid-State Circuits, May 2009, vol. 44, No. 5.

Ashok Swaminathan, "A Wide-Bandwidth 2.4 GHz ISM Band Fractional-N PLL With Adaptive Phase Noise Cancellation", IEEE Journal of Solid-State Circuits, Dec. 2007, vol. 42, No. 12.

Kevin J. Wang et al., "Spurious-Tone Suppression Techniques Applied to a Wide-Bandwidth 2.4GHz Fractional-N PLL", 2008 IEEE International Solid-State Circuits Conference, Feb. 5, 2008, La Jolla, CA.

Hyungki Huh et al., "Comparison Frequency Doubling and Charge Pump Matching Techniques for Dual-Band Fractional-N Frequency Synthesizer", IEEE Journal of Solid-State Circuits, Nov. 2005, vol. 40, No. 11.

Simon Damphousse et al., "All Digital Spread Spectrum Clock Generator for EMI Reduction", IEEE Journal of Solid-State Circuits, Jan. 2007, vol. 42, No. 1.

Robert B. Staszewski et al., "All Digital Frequency Synthesizer in Deep-Submicron CMOS", Sep. 11, 2006, p. 94-99, Wiley-Interscience.

PCT International Search Report, Application No. PCT/US2011/45396, Dec. 6, 2011.

* cited by examiner

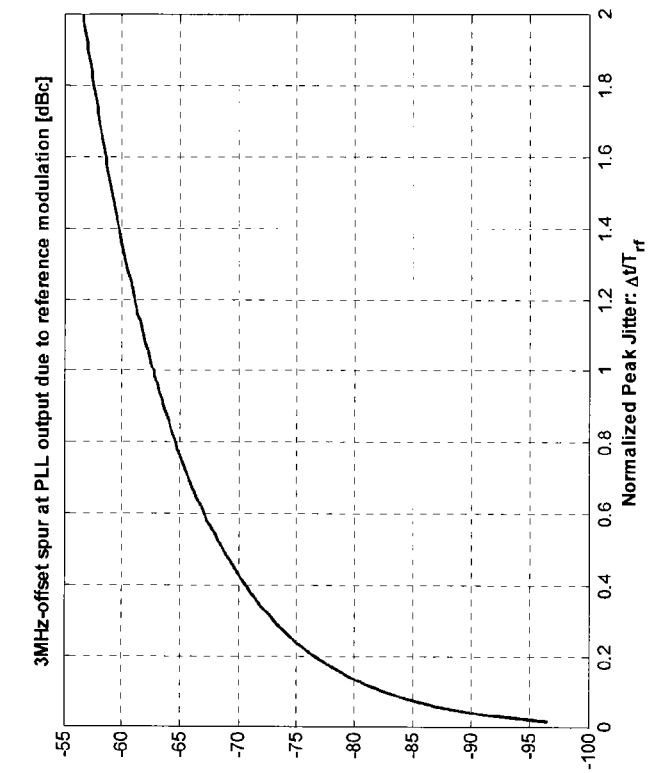
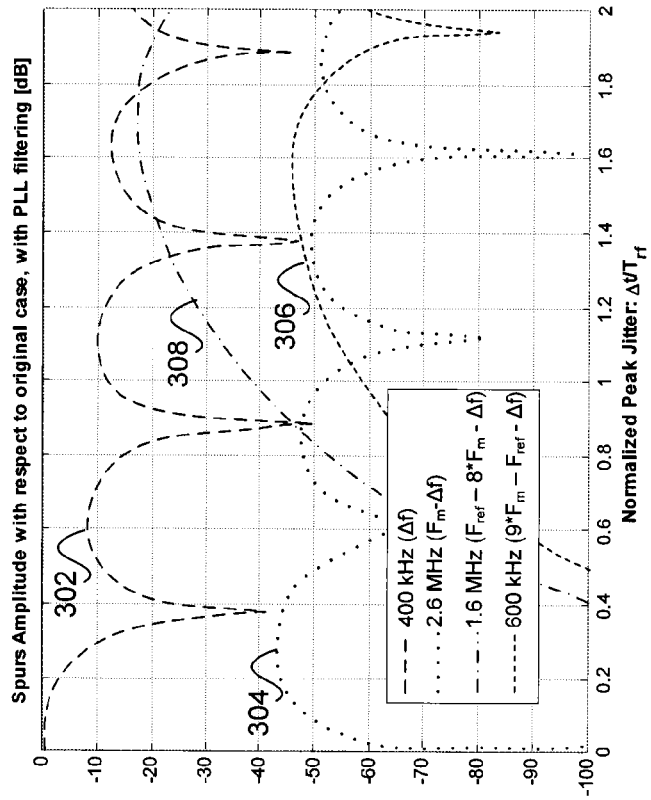
Fig. 4b
Fig. 4a

FRACTIONAL SPUR REDUCTION USING CONTROLLED CLOCK JITTER

CROSS REFERENCE TO RELATED APPLICATIONS

This application is a Continuation Application of U.S. patent application Ser. No. 13/191,329, "Fractional Spur Reduction using Controlled Clock Jitter" filed on Jul. 26, 2011, which in turn claims the priority to U.S. Provisional App. No. 61/368,459 entitled "A PLL Fractional Spurs Reduction" filed Jul. 28, 2010. The entire disclosures of the prior applications are incorporated by reference herein in their entirety.

BACKGROUND

Particular embodiments generally relate to phase lock loops (PLLs). Unless otherwise indicated herein, the approaches described in this section are not prior art to the claims in this application and are not admitted to be prior art by inclusion in this section.

FIG. 1a discloses an example of a PLL 100. PLL 100 may be part of a transceiver that transmits/receives a radio frequency signal. PLL 100 generates a local oscillator (LO) signal that is used in upconversion or downconversion of a radio frequency signal in a transceiver. PLL 100 includes a crystal oscillator 102 (TCXO) configured to generate a reference clock signal. TCXO 102 may be an external component to a chip including PLL 100. Reference clock buffers 104 buffer the reference clock signal and output the signal to a phase frequency detector 106. Phase frequency detector 106 compares a phase difference between the clock signal and a feedback signal received in a feedback loop. Frequency detector 106 outputs a signal that represents the difference in phase between the two input signals.

A charge pump 108 and a loop filter 110 convert the phase information output by phase frequency detector 106 into a voltage or current. For example, a tuning voltage Vtune is a control signal input into a radio frequency voltage controlled oscillator (RF VCO). RF VCO generates a sinusoidal signal with a frequency controlled by tuning voltage Vtune. RF buffers 114 then output the RF signal generated by the RF VCO.

The sinusoidal signal output by RF VCO 112 is also fed back into an integer frequency divider 116. A sigma-delta (SD) modulator 118 and integer frequency divider 116 provide non-integer frequency division capability. A fractional average division factor may be achieved. The phase of the signal output by integer frequency divider 116 is compared with the phase from the input reference signal. The comparison is used to adjust the RF VCO frequency to keep phase lock.

Fractional spurs may be generated in PLL 100. Two main mechanisms may cause the generation. For example, a fractional spur may be generated due to sigma-delta modulator quantization noise combined with non-linearity of the PLL loop. A sigma-delta modulator may be used to drive the integer frequency divider division factor to obtain a fractional average division factor, which may introduce noise into PLL 100. Non-linearity of several blocks in PLL 100, such as integer frequency divider 116, phase frequency detector 106, and charge pump 108 may cause generation of fractional spurs.

Fractional spurs may also be generated by sub-sampling of a radio frequency (RF) carrier (RF attacker) by blocks of PLL 100 working at the reference frequency $F_{ref}$. For example, frequency divider 116, phase frequency detector 106, charge pump 108, and reference clock buffers 104 are usually sensitive digital circuits clocked at reference frequency $F_{ref}$. These blocks sub-sample the RF attacker and convert the RF attacker to baseband as a fractional spur. These spurs may be considered dominant in PLL 100. The spurs may be generated from RF attackers at the local oscillation (LO) frequency and the multiple/sub-multiples of the LO frequency.

FIG. 1b shows an example of the spectrum of the RF carrier generated by PLL 100, featuring phase noise and fractional spurs. At 120, an RF carrier is shown at the local oscillating frequency $f_{lo}$. At 122, phase noise is shown. Fractional spurs are shown at 124. The fractional spurs are generated at an offset Δf from the RF carrier. If the offset Δf is smaller than the PLL bandwidth, the fractional spurs are not filtered by PLL 100 and can degrade the RF carrier spectrum and also system performance. A spectral emission mask can be violated in the transmitter because the baseband spectrum is up-converted around the fractional spurs. Also, reception in the presence of strong interferers (blockers) can be compromised in the receiver because fractional spurs down-convert the interferer to baseband.

FIG. 1c shows an example of the generation of fractional spurs. An RF attacker may be any RF carrier in the system that may result in spurious tones. RF attackers may be the RF signals distributed by RF VCO 112 and RF buffers 114 across a chip that includes the transmitter/receiver. The RF attackers may couple to blocks of PLL 100 that are implemented as digital circuits that are clocked at reference frequency $F_{ref}$. These blocks are typically reference clock buffers 104, phase frequency detectors 106, charge pump 108, and frequency divider 116. Coupling may occur in different ways, such as substrate coupling, ground/supply coupling, magnetic coupling, etc.

If an RF attacker is superimposed on a clock signal of a frequency $F_{ref}$ and this clock signal drives an edge-sensitive digital circuit, the RF attacker undergoes sub-sampling. The resulting signal is affected by jitter and may feature two sidebands at Δf from the clock signal fundamental frequency $F_{ref}$. FIG. 1d shows the effects of an RF attacker. For example, at 126, an RF attacker 128 is superimposed on a clock signal 120. After clock signal 120 is input into an edge-sensitive digital block 130, jitter 132 appears on clock signal 120. For example, sidebands 136 result at Δf from clock signal 120 fundamental frequency. Sidebands 136 are transferred at the output of PLL 100 as sidebands at Δf around the RF carrier frequency $f_{lo}$, which are referred to as fractional spurs. Because the fractional spurs are amplified by PLL feedback division factor (>>1), even a small RF attacker can cause spurious tones to appear at the RF output. For example, at 134, an RF attacker is shown at frequency $f_{rf}=kF_{ref}+\Delta f$, where k is an integer. At 136, the fractional spurs are shown at the output as +/−Δf sidebands around the clock signal frequency $F_{ref}$. These fractional spurs are then amplified by the PLL as +/−Δf sidebands 136 around the RF carrier frequency $f_{lo}$.

SUMMARY

In one embodiment, an apparatus includes a jitter generator configured to receive a reference clock; add jitter to the reference clock; and output the reference clock with the included jitter to a phase lock loop (PLL). The PLL is used to generate a local oscillator (LO) signal for a transceiver. A jitter controller outputs a signal to the jitter generator to control a characteristic of the jitter added to the reference clock. The reference clock with the added jitter is used to reduce a fractional spur caused by a radio frequency (RF) attacker coupling into the PLL.

In one embodiment, the characteristic of the jitter adds a small amount of energy inside a bandwidth of the PLL to limit degradation of the RF signal spectrum.

In one embodiment, energy that is out of the PLL bandwidth is filtered out by the PLL.

In one embodiment, the characteristic of the jitter includes a magnitude comparable to a period of the RF attacker causing the fractional spur.

In one embodiment, the jitter eliminates the fractional spur.

In one embodiment, a system where the PLL is configured to receive the reference clock with the added jitter and output the LO signal based on the reference clock with the added jitter.

In one embodiment, the method includes receiving a reference clock. A control signal is received to control a characteristic of jitter added to the reference clock. The method adds the jitter to the reference clock based on the control signal and outputs the reference clock with the added jitter to a phase lock loop (PLL). The PLL is used to generate a local oscillator (LO) signal for a transceiver. The reference clock with the added jitter is used to reduce a fractional spur caused by a radio frequency (RF) attacker coupling into the PLL.

In one embodiment, adding the jitter includes selecting a delayed reference clock signal from a first delay line that includes a plurality of delay elements, wherein each delay element delays the reference clock by a delay amount.

In one embodiment, receiving the control signal includes receiving a selection code indicating which delayed reference clock signal from one of the delay elements should be selected.

In one embodiment, a sequence of selection codes is received to select different delayed reference signals to control the characteristic of the jitter.

The following detailed description and accompanying drawings provide a more detailed understanding of the nature and advantages of the present invention.

BRIEF DESCRIPTION OF THE DRAWINGS

FIG. 4a shows the effect of PLL filtering according to one embodiment.

FIG. 4b shows a 3 MHz offset spur at the PLL output due to the reference modulation according to one embodiment.

DETAILED DESCRIPTION

Described herein are techniques for a reference clock generation system. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1A:
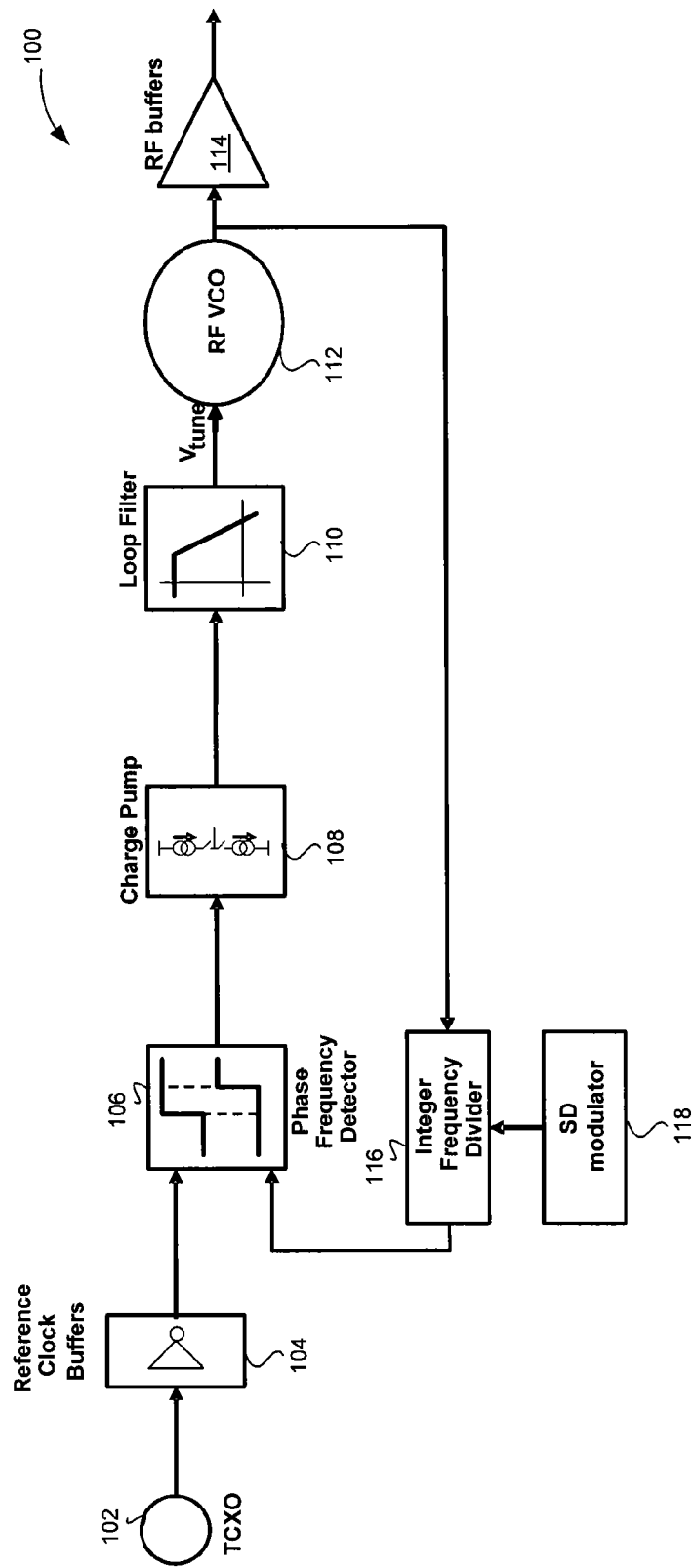
FIG. 1a shows an example of a PLL.
Figure 1B:
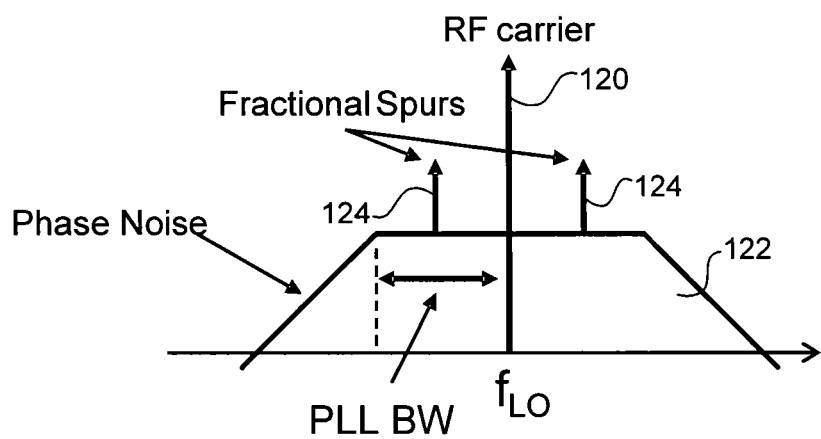
FIG. 1b shows an example of the RF carrier spectrum and also fractional spurs.
Figure 1C:
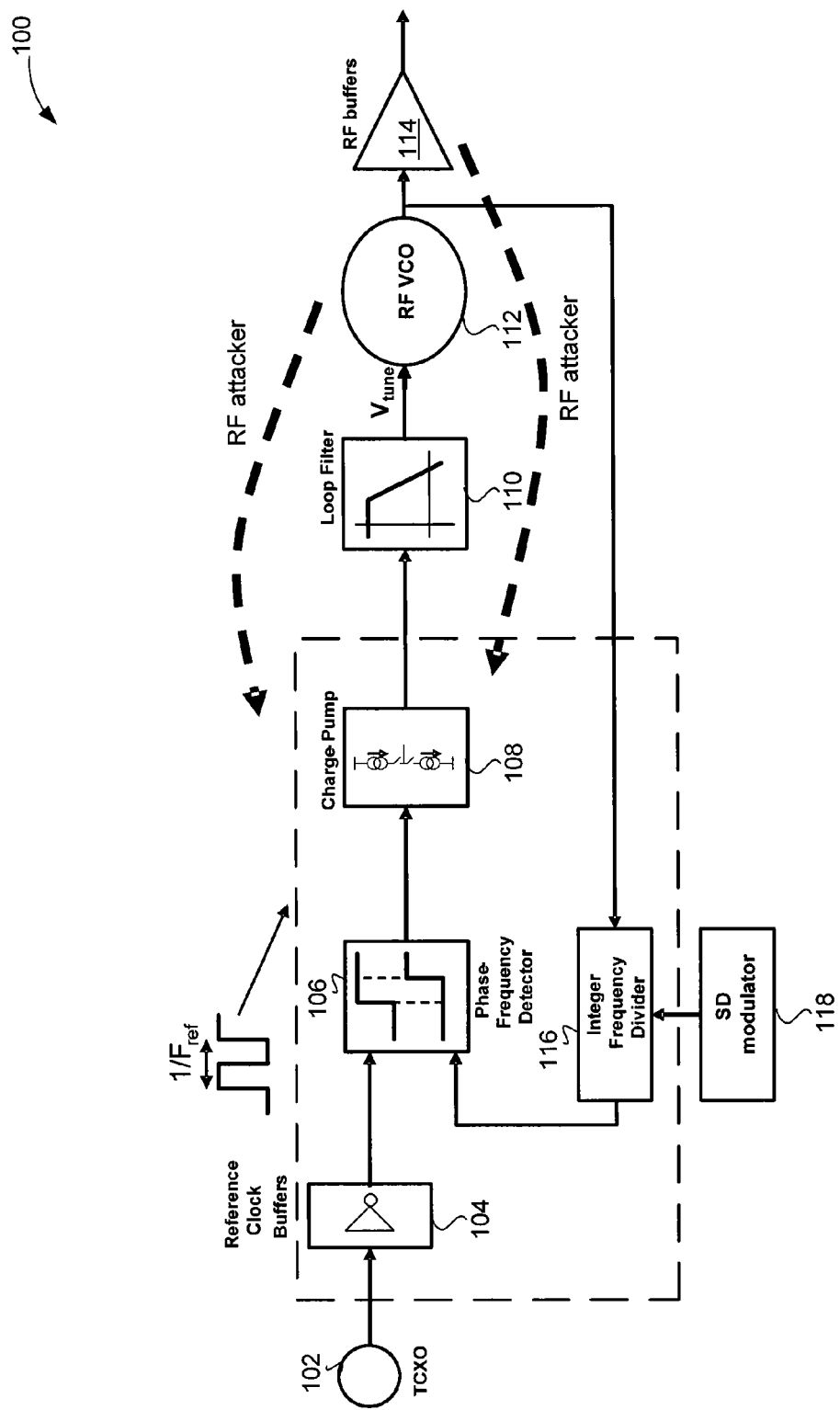
FIG. 1c shows an example of the generation of fractional spurs.
Figure 1D:
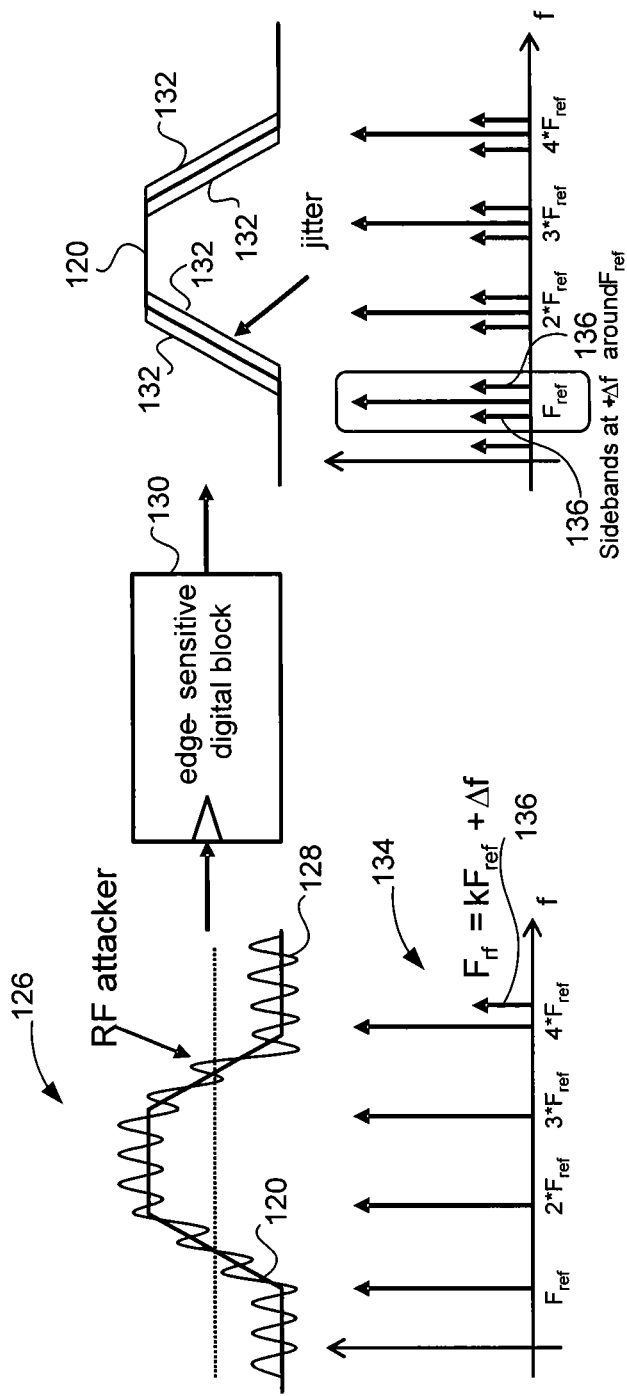
FIG. 1d shows the effects of an RF attacker.
Figure 2:
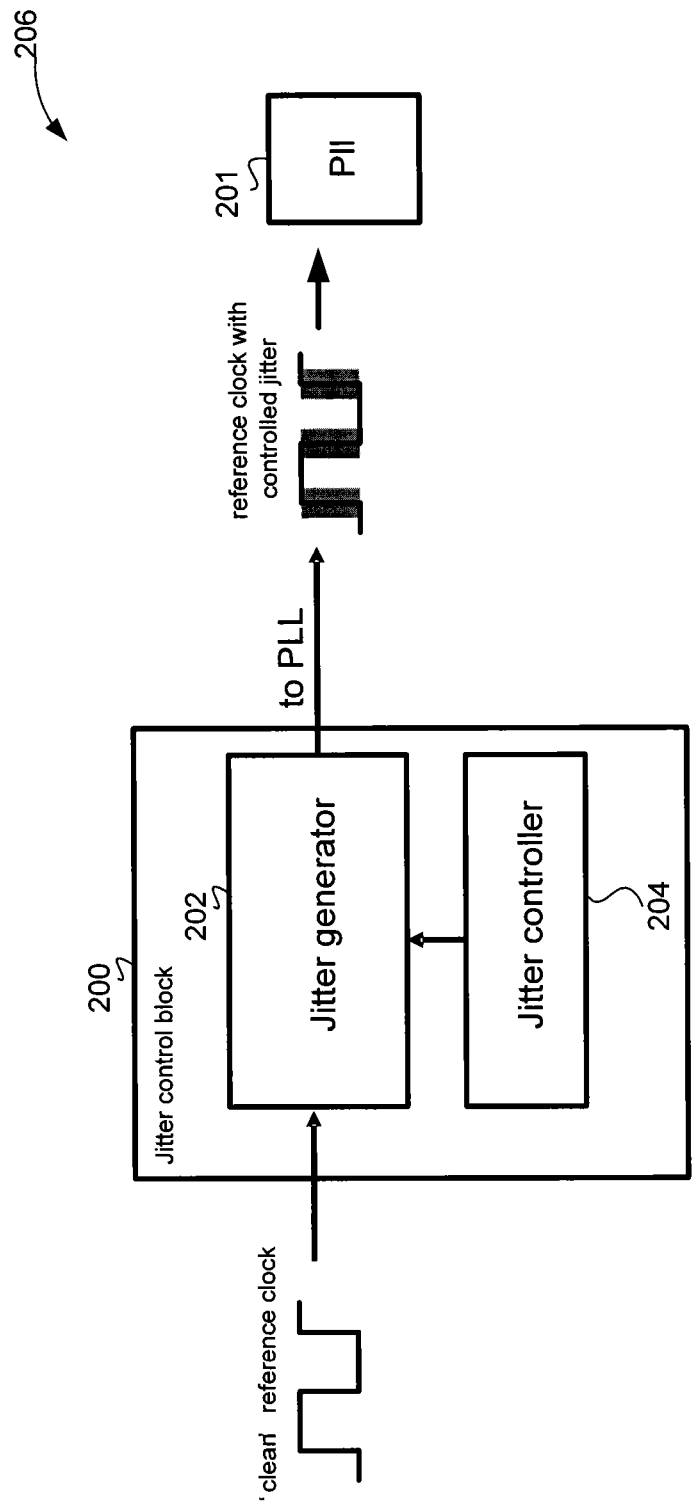
FIG. 2 depicts an example of a transceiver that includes a jitter control block according to one embodiment.

FIG. 2 depicts an example of a transceiver 206 that includes a jitter control block 200 according to one embodiment. Jitter control block may be coupled to a PLL 201. PLL 201 generates a local oscillator (LO) signal that is used in upconversion or downconversion of a radio frequency signal in transceiver 206. PLL 201 may include similar elements to the PLL described in FIG. 1a. However, jitter control block 200 receives a reference clock signal from a crystal oscillator and outputs a reference clock signal with jitter to PLL 201. For example, a clean reference clock may be input into a jitter generator 202. For example, jitter generator 202 may transform a jitter-free reference clock signal ("clean") to a clock signal with jitter that includes certain characteristics. Jitter generator 202 may introduce a controlled amount of jitter $\tau(t)$ in the clean reference clock signal. Jitter generator 202 outputs the reference clock with controlled jitter.

Jitter controller 204 drives jitter generator 202 and controls various characteristics of the jitter, such as amplitude, frequency, spectral characteristics, etc. In one embodiment, being controlled means that jitter features a small energy inside the PLL bandwidth so that the RF carrier spectrum degradation is small. By this means, out-of-band energy may be effectively filtered by the PLL input to output low pass transfer function. Thus, most jitter energy may be outside of the PLL bandwidth. Also, jitter magnitude (peak or root mean square (RMS), depending on the characteristics of jitter $\tau(t)$) should be significant compared to the period of an RF attacker, $1/F_{RF}$.

Depending on the spectrum of jitter $\tau(t)$, a fractional spur may be attenuated or completely eliminated, and moved to a more convenient frequency offset (e.g., outside the PLL bandwidth) where the fractional spur can be more effectively filtered. Also, the fractional spur may be converted to a noise floor (e.g., white noise), which reduces the spectral emission per unit bandwidth. The noise floor may include the same energy as the fractional spur, but at a lower spectral density. Thus, instead of a large tone, a noise floor exists that may be filtered and in some cases be less detrimental for system performance.

The clock jitter is introduced to mitigate self-interference from RF signals (RF attackers) in RF transceiver 206. The clock signal is not the attacker in this case. Rather, the introduction of clock jitter reduces the effect of RF attackers on the transceiver's performance.

In one example, sinusoidal jitter is introduced into the reference clock. For example, sinusoidal jitter may have a peak amplitude $\Delta t$ and modulation frequency $F_m$. The jitter may be defined by:

$\cos \lfloor 2\pi F_{ref}t + 2\pi F_{ref}\Delta t \cdot \cos(2\pi F_m t) \rfloor$ $F_{ref}$=26 MHz, $F_m$=3 MHz The RF attacker frequency is chosen to cause a fractional spur at $\Delta f$=400 kHz frequency offset:

$F_{RF}=K\,F_{ref}+\Delta f$ with $\Delta f=400$ kHz

Thus, fractional spurs may appear as follows due to RF attacker sub-sampling in components of PLL 201:

Fractional spur residual at 400 kHz

New spurs at 1 MHz+/−400 kHz (i.e. 600 kHz and 1.4 MHz)

New spurs at 2 MHz+/−400 kHz (i.e. 1.6 MHz and 2.4 MHz)

Modulation spur at 3 MHz offset due to reference clock jitter

Figure 3:
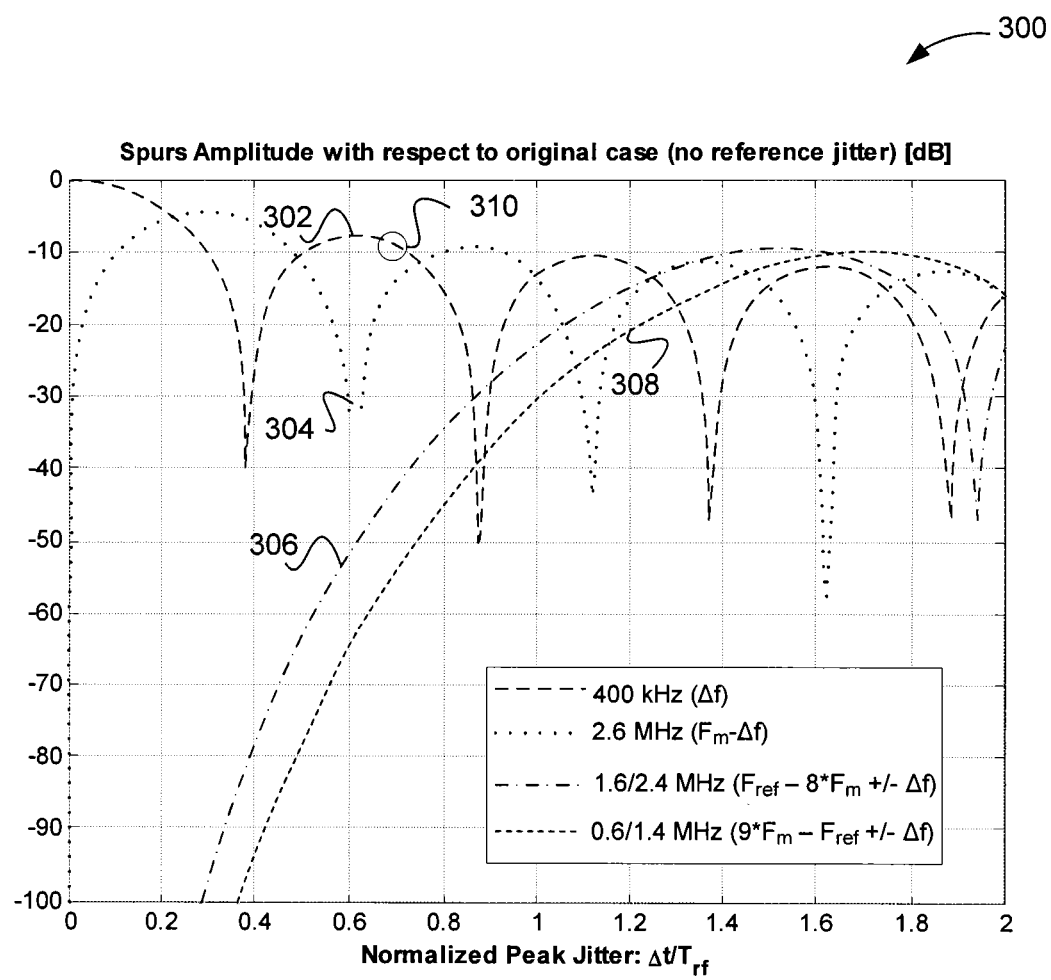
FIG. 3 shows a graph of the spurs amplitude with respect to the original case with no jitter according to one embodiment.

The amplitude of the fractional spur at 400 kHz offset relative to the amplitude of the fractional spur at 400 kHz offset as described in the background (the case with no jitter added to the reference clock signal) is reduced as shown in FIG. 3. New spurs are generated at larger frequency offsets (1 MHz+−400 kHz and 2 MHz+−400 kHz).

FIG. 3 shows a graph 300 of the spurs amplitude with respect to the clock signal with no jitter according to one embodiment. The Y axis is the reduction in amplitude in decibels (dB) from a conventional clock with no jitter. Also, the X axis is the normalized peak jitter $\Delta t/T_{RF}$. As shown, a reduction in amplitude has occurred for the 400 KHz ($\Delta f$) spur shown at 302, while new spurs are generated: the 2.6 MHz ($F_m-\Delta f$) spur shown at 304, the 1.6/2.4 MHz ($F_{ref}-8*F_m+/-\Delta f$) spurs shown at 306, and the 0.6/1.4 MHz ($9*F_m-F_{ref}+/-\Delta f$) spurs shown at 308. Also, as shown at 310, a greater than 10 dB reduction for the 400 kHz signal for $\Delta t>0.7*T_{RF}$ is obtained. Also, graph 300 does not take into account low pass filtering of PLL 201, which removes the spurs that are outside of the PLL's bandwidth.

In one embodiment, by increasing the jitter peak magnitude with respect to the RF attacker period, the 400 KHz spur can be reduced significantly and even eliminated for some $\Delta t/T_{RF}$ ratios. Also, the energy of the spurs is transferred to tones at higher offsets where filtering of PLL 201 can be more effective. For example, FIG. 4a shows the effect of PLL filtering according to one embodiment. In the example, the bandwidth of the PLL is set to 80 kHz, thus progressively attenuating spurs at offsets greater than 80 kHz. At 302, the 400 KHz spur is attenuated by more than 10 dB for $\Delta T>0.7*T_{RF}$. The new generated tones at 304 and 306 are >18 dB below the original 400 KHz tone. The overall PLL spectral performance is significantly improved with respect to the original case.

FIG. 4b shows a 3 MHz modulation spur at the PLL output due to the reference modulation according to one embodiment. A 3 MHz modulation spur also appears at a <55 dBc level. The magnitude of the modulation spur at 3 MHz may be reduced by increasing modulation frequency $F_m$. Also, by proper choice of the modulation frequency $F_m$ of the jitter, newly generated tones can be arranged in a more convenient way (e.g., avoiding the 600 KHz tone, moving the tones to higher offsets, etc.).

Figure 5:
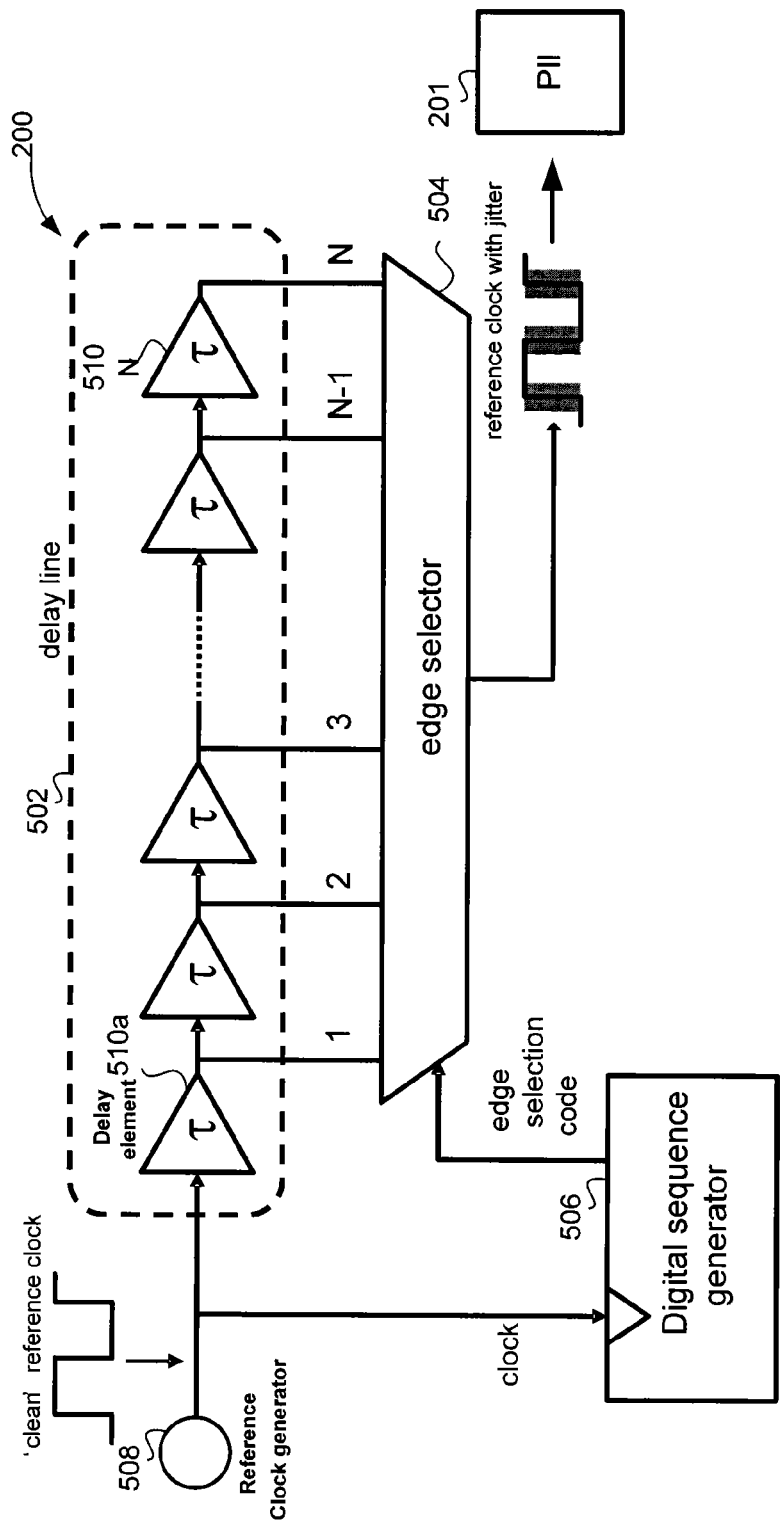
FIG. 5 shows a more detailed example of the jitter control block according to one embodiment.

FIG. 5 shows a more detailed example of jitter control block 200 according to one embodiment. A delay line 502, an edge selector 504, and a digital sequence generator 506 may be included as jitter generator 202 and jitter controller 204. In one example, delay line 502 and edge selector 504 may be considered part of jitter generator 202 and digital sequence generator 506 as part of jitter controller 204.

A clean reference clock is generated by a reference clock generator 508. This is input into delay line 502. Delay line 502 includes a number of delay elements 510a-510N. Each delay element 510 may be of the same unit of delay, such as a delay τ. Delay line 502 creates a set of delayed replicas of the clean reference clock.

Edge selector 504 includes N inputs and one output that go to PLL 201. The N inputs are from each delay element 510. Thus, N delayed replicas of the clean reference clock are input into edge selector 504. Edge selector 504 then selects one of the N delayed replicas according to a value of an edge selection code received from digital sequence generator 506. In one embodiment, the edge selection code is updated once every reference clock period $1/F_{ref}$. Timing may be provided to guarantee a glitch-free output of the reference clock with jitter.

Digital sequence generator 506 generates a sequence $q_k$ of edge selection codes to introduce the desired amount of jitter onto the clean reference clock signal with the desired spectral characteristics. The digital sequence generator is clocked at the clock frequency $F_{ref}$ to update the edge selection code once every reference period. The jitter introduced can be expressed as $q_k*\tau$, with $q_k-1\ldots N$. Digital sequence generator 506 generates the edge selection code to select a different delay element. The selection of different delayed replicas of the clean reference clock includes jitter on the reference clock output by edge selector 504.

Figure 6:
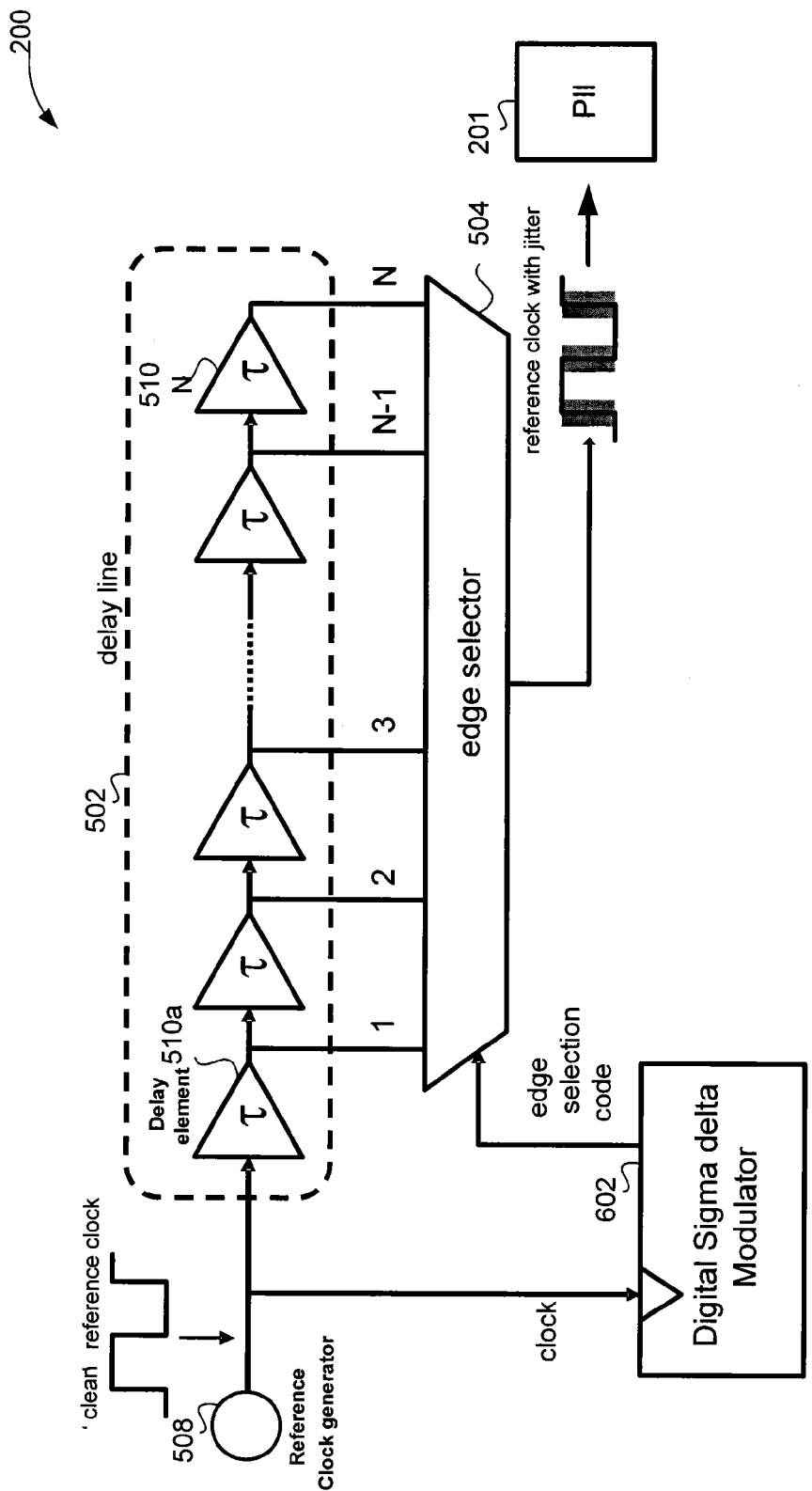
FIG. 6 depicts an example of the jitter control block using a digital sigma-delta modulator according to one embodiment.

Digital sequence generator 506 may be implemented in different ways. For example, FIG. 6 depicts an example of jitter control block 200 using a digital sigma-delta modulator 602 according to one embodiment. Other ways may also be used, such as a programmable sequence generator using a shift register/look-up table (e.g. for sinusoidal, squarewave, and triangular wave modulations), a pseudo-random sequence generator using shift registers, and other implementations.

Digital sigma-delta modulator 602 may be an $L^{th}$ order digital sigma-delta modulator. For example, a multi-stage noise shaping (MASH) sigma-delta modulator may be used. A $\Sigma\Delta$ input (not shown) may be received at digital sigma-delta modulator 602. Digital sigma-delta modulator 602 then codes the $\Sigma\Delta$ input into the edge selection code. The number of delay elements N may be equal to the number of levels at the $\Sigma\Delta$ output of the edge selection code. That is, the output would have a bit specific to a delay element. Digital sigma-delta modulator 602 may introduce quantization noise, which may corrupt the reference clock spectrum. However, the noise-shaping capability of digital sigma-delta modulator 602 pushes the quantization noise energy to high frequencies. For example, the quantization noise energy from digital sigma-delta modulator 602 is high pass shaped and pushed around the frequency $F_{ref}/2$. The input to output low pass transfer function of PLL 201 can attenuate the noise, since the PLL bandwidth is usually much smaller than the reference clock frequency $F_{ref}$. In this case, filtering of PLL 201 can suppress this noise at the PLL output. Also, the $\Sigma\Delta$ input can be selected to optimize spectral performance and add dithering to avoid idle tones.

Figure 7:
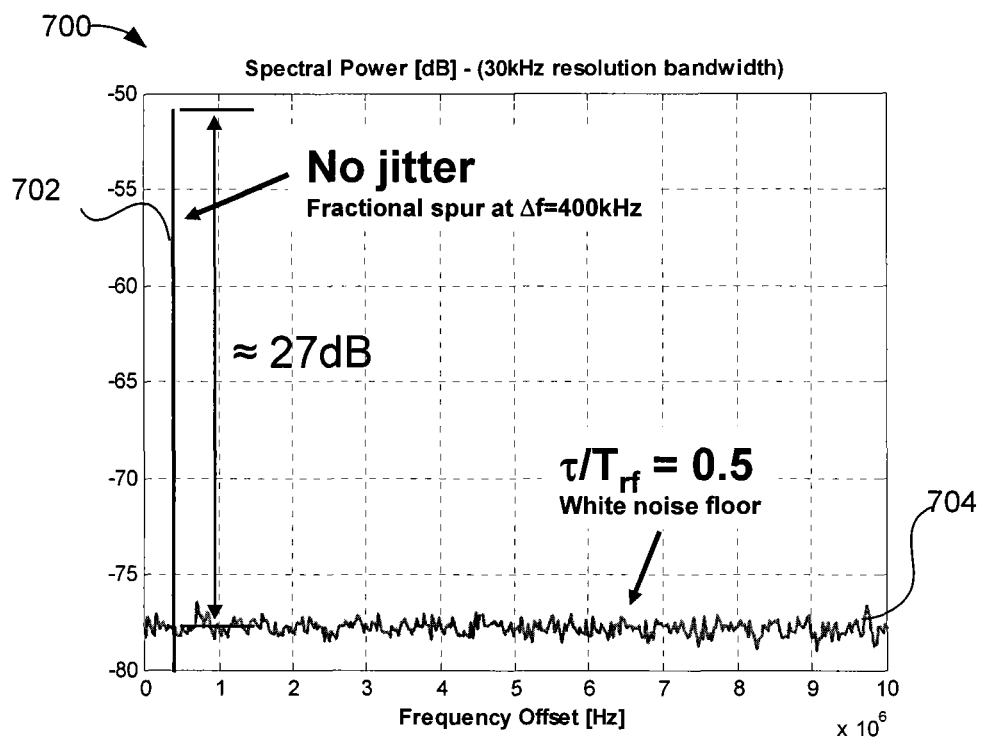
FIG. 7 shows the conversion of a fractional spur to white noise according to one embodiment.

Digital sigma-delta modulator 602 may be configured to convert a fractional spur into white noise. FIG. 7 shows the conversion of a fractional spur to white noise according to one embodiment. A fractional spur is shown at 702, which occurs when no jitter is included in the reference clock signal. At 704, a white noise floor is shown. In this case, the spectral power of the fractional spur at 702 has been converted into a white noise floor, with same energy as the original spur but constant spectral density from 0 offset to $F_{ref}/2$ offset. For example, as the normalized unit delay of the reference clock with jitter approaches half of the period of the RF attacker, the spur is gradually converted into a white noise floor. This results in a spectral power reduction of 27 dB, considering a 30 kHz spectral density integration bandwidth and $F_{ref}=26$ MHz. The energy of the spur is converted into a noise floor that has the same energy, but has a lower spectral density.

Figure 8:
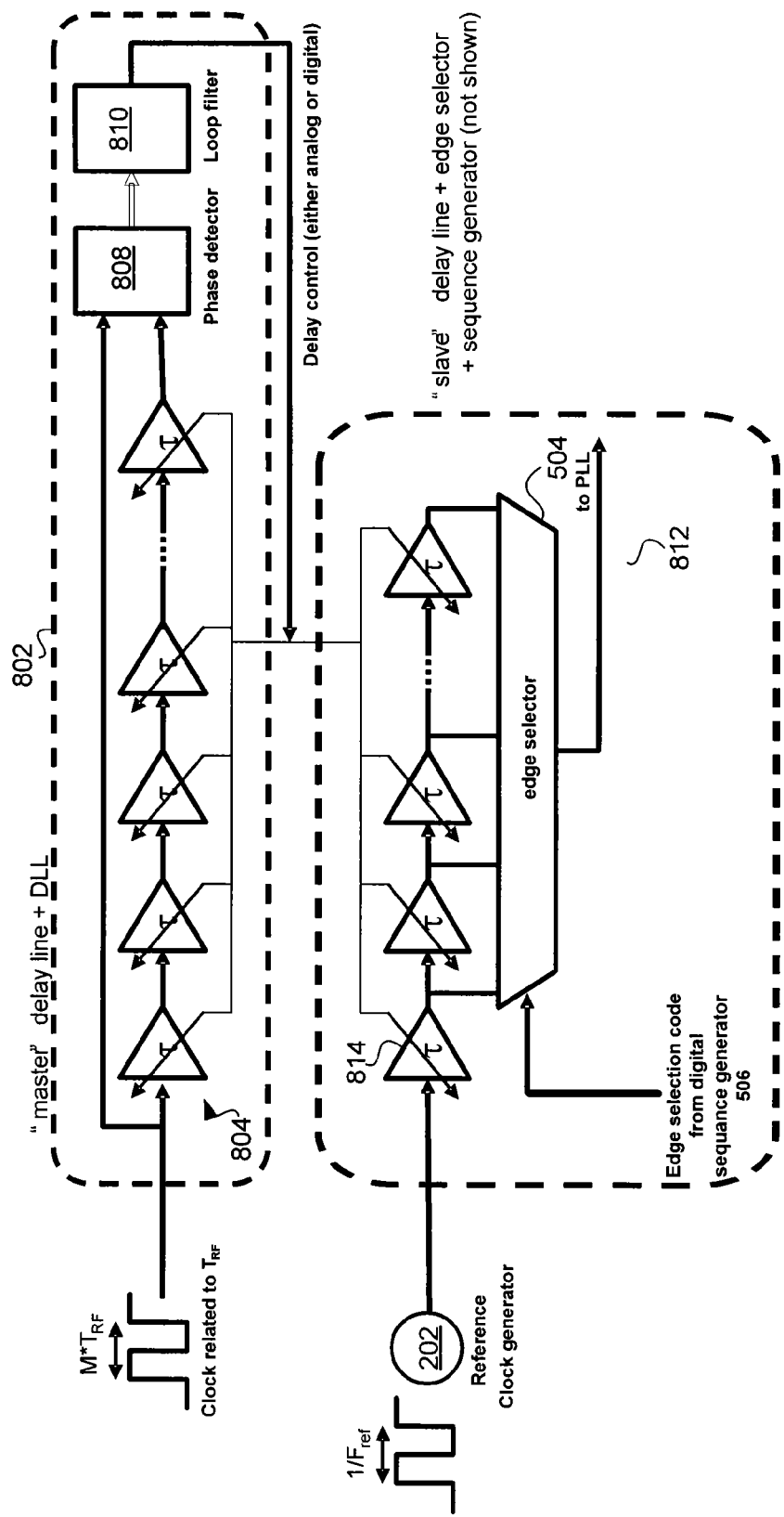
FIG. 8 shows an example of applying programmability to the jitter control block according to one embodiment.

The spectral power reduction may be optimized when the unit delay of the reference clock with jitter is centered around $0.5*T_{rf}$ (half the period of the RF attacker). In some cases, more RF attackers are present at super- or sub-harmonics of the local oscillator frequency. For a given RF channel, only one attacker may be generating the spur closest to the carrier. Particular embodiments may add programmability to delay line 502 to optimize the delay for the most dangerous RF attacker in a channel-dependent way. FIG. 8 shows an example of applying programmability and calibration capability to jitter control block 200 according to one embodiment. In some communication standards, the range of LO frequencies to be covered is broad, which determines a large variation of $T_{RF}$ and makes optimizing the delay τ to $0.5\,T_{RF}$ difficult. A first block 802 includes a master delay line embedded into a delay lock loop (DLL). A delay line 804 receives a clock related to $T_{RF}$ (the period of the RF attacker). The DLL composed of programmable delay elements, a phase detector 808 and a loop filter 810 provides a calibrated delay control (either analog or digital) to a second block 812.

Second block 812 includes a slave delay line 814, edge selector 504, and digital sequence generator 506. Slave delay line 814 receives a reference clock signal from reference clock generator 202. First block 802 and second block 812 may be used in a master/slave configuration to tune/calibrate the unit delay to be as close as possible to $0.5\,T_{RF}$ against process-voltage-temperature (PVT) variations and $T_{ref}$ variations. In this case, the appropriate delay τ can be achieved to introduce the desired jitter. The DLL is used to tune/calibrate the unit delay to be as close as $0.5\,T_{RF}$ as possible.

Figure 9:
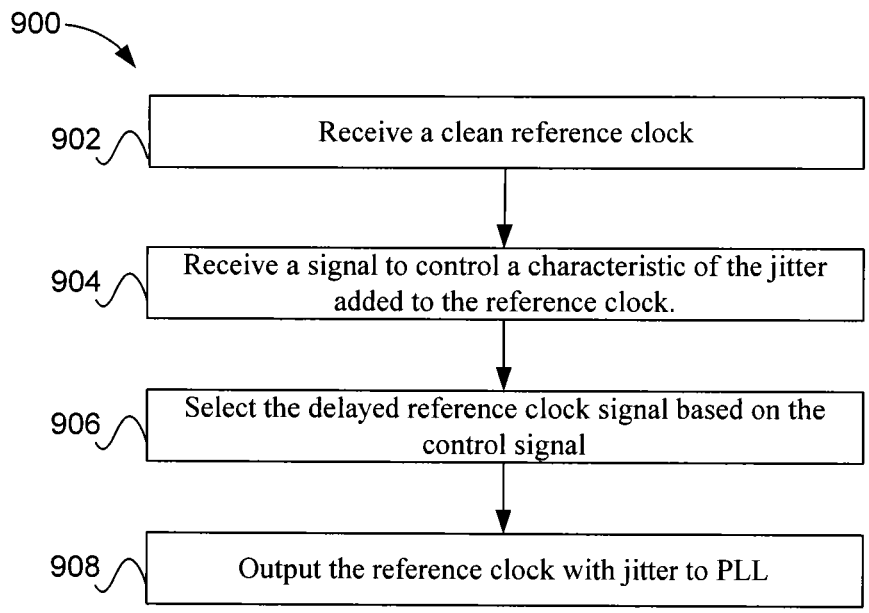
FIG. 9 depicts a simplified flowchart of a method for generating a clock signal with jitter according to one embodiment.

FIG. 9 depicts a simplified flowchart 900 of a method for generating a clock signal with jitter according to one embodiment. At 902, a clean reference clock is received. A clean reference clock may be generated by reference clock generator that is off-chip. Jitter is then added to the reference clock. For example, at 904, a signal is received to control a characteristic of the jitter added to the reference clock. A delayed reference clock signal from a different delay element 510 may be selected to introduce the amount of jitter into the reference clock signal. At 906, the delayed reference clock signal is selected based on the control signal. At 908, the reference clock with jitter is output to PLL 201. The reference clock with the included jitter is used to reduce fractional spurs located around a radio frequency carrier generated by PLL 201.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   a clock generator configured to add jitter of a controlled characteristic to a first reference clock to generate a second reference clock; and
   a phase locked loop (PLL) configured to generate a local oscillator (LO) signal for a transceiver based on the second reference clock to reduce a fractional spur in the LO signal caused by a radio frequency (RF) signal coupling into the PLL,
   wherein the jitter of the controlled characteristic adds an amount of energy inside a bandwidth of the PLL.

2. The apparatus of claim 1, wherein the clock generator is configured to control a variable delay to the first reference clock to generate the second reference clock.

3. The apparatus of claim 2, wherein the clock generator further comprises a delay line including a plurality of delay elements that each delay element adds an amount of delay to the first reference clock.

4. The apparatus of claim 3, wherein the clock generator comprises an edge selector configured to vary a selection of one of the delay elements to change the variable delay of the second reference clock to the first reference clock.

5. The apparatus of claim 4, wherein the clock generator comprises a sequence generator configured to generate a sequence of selection codes to vary the selection of the one of the delay elements.

6. The apparatus of claim 3, wherein
   the delay line is a first delay line, and the clock generator further comprises a second delay line;
   a delay lock loop is configured to lock the second delay line to a signal with a period related to the RF signal to output a delay control signal; and
   the delay control signal is used to tune the delay amount of the delay elements in the first delay line.

7. The apparatus of claim 1, wherein the jitter of the controlled characteristic limits degradation of the RF signal spectrum.

8. The apparatus of claim 7, wherein energy that is out of the PLL bandwidth is filtered out by the PLL.

9. The apparatus of claim 1, wherein the controlled characteristic of the jitter includes a magnitude comparable to a period of the RF signal that causes the fractional spur.

10. The apparatus of claim 1, wherein the jitter eliminates the fractional spur.

11. The apparatus of claim 1, wherein the jitter has a modulation frequency that moves at least a portion of the fractional spur to a frequency offset out of a bandwidth of the PLL.

12. The apparatus of claim 1, wherein the jitter converts the fractional spur to a noise floor.

13. A method comprising:
   generating jitter of a controlled characteristic;
   adding the jitter into a first reference clock to generate a second reference clock;
   generating a local oscillator (LO) signal using a phase-locked loop (PLL) based on the second reference clock to reduce a fractional spur in the LO signal caused by a radio frequency (RF) signal coupling into the PLL,
   wherein the jitter of the controlled characteristic adds an amount of energy inside a bandwidth of the PLL.

14. The method of claim 13, wherein adding the jitter into the first reference clock to generate the second reference clock further comprises:
   delaying the first reference clock by a controlled variable delay to generate the second reference clock.

15. The method of claim 14, wherein delaying the first reference clock by the controlled variable delay to generate the second reference clock further comprises:
selectively outputting one of a plurality of delayed signals output from a plurality of delay elements that form a delay line to delay the first reference clock.

16. The method of claim 15, wherein selectively outputting one of the plurality of delayed signals output from the plurality of delay elements that form the delay line to delay the first reference clock further comprises:
receiving a selection code indicating which delayed signal from one of the delay elements should be selected.

17. The method of claim 16, further comprising:
generating the selection code to control the characteristic of the jitter.

18. The method of claim 15, further comprising:
locking a delay lock loop to a signal with a period related to the RF signal;
generating a delay control signal based on the locked delay lock loop; and
tuning the delay elements in the delay line based on the delay control signal.

19. The method of claim 16, wherein receiving the selection code indicating which delayed signal from one of the delay elements should be selected further comprises:
receiving a sigma delta input; and
interpreting the sigma delta input to determine which delayed signal from one of the delay elements should be selected.

20. The method of claim 13, wherein generating the jitter of the controlled characteristic further comprises:
generating the jitter to have a magnitude comparable to a period of the RF signal that causes the fractional spur.

* * * * *